United States Patent
Fujihara et al.

(10) Patent No.: US 9,434,604 B2
(45) Date of Patent: Sep. 6, 2016

(54) CAP, SEMICONDUCTOR DEVICE INCLUDING THE CAP, AND MANUFACTURING METHOD THEREFOR

(71) Applicant: SHINKO ELECTRIC INDUSTRIES CO., LTD., Nagano (JP)

(72) Inventors: Kosuke Fujihara, Nagano (JP); Hideaki Sakaguchi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 2 days.

(21) Appl. No.: 14/607,260

(22) Filed: Jan. 28, 2015

(65) Prior Publication Data

US 2015/0263238 A1    Sep. 17, 2015

(30) Foreign Application Priority Data

Mar. 17, 2014   (JP) .................................. 2014-054009

(51) Int. Cl.
*B81B 7/00* (2006.01)
*H01L 31/0203* (2014.01)
*H01S 5/022* (2006.01)
*H01L 33/58* (2010.01)

(52) U.S. Cl.
CPC ......... *B81B 7/0067* (2013.01); *H01L 31/0203* (2013.01); *H01L 33/58* (2013.01); *H01S 5/02208* (2013.01); *H01L 2933/0058* (2013.01); *Y10T 428/24322* (2015.01)

(58) Field of Classification Search
CPC ....... H01L 29/82; H01L 33/48; H01S 5/022; B81B 7/0067
See application file for complete search history.

(56) References Cited

U.S. PATENT DOCUMENTS

| 5,798,557 A | 8/1998 | Salatino et al. | |
|---|---|---|---|
| 2006/0125879 A1* | 6/2006 | Fujii | B41J 2/14274 347/54 |
| 2007/0029654 A1* | 2/2007 | Sunohara | B81C 1/00301 257/678 |
| 2011/0018021 A1* | 1/2011 | Kim | H01L 33/20 257/98 |

FOREIGN PATENT DOCUMENTS

JP    H10-098121    4/1998

* cited by examiner

Primary Examiner — Lawrence-Linh T Nguyen
(74) Attorney, Agent, or Firm — IPUSA, PLLC (57) ABSTRACT

A cap for installing a semiconductor device that can send or receive a light having a predetermined wavelength, the cap including a recess for installing the semiconductor device, the recess being defined by a through-hole penetrating an upper surface of a silicon substrate and a lower surface of the silicon substrate, the through-hole having an upper end part of the through-hole on a side of the upper surface of the silicon substrate and a lower end part of the through-hole on a side of the lower surface of the silicon substrate, and a coating film formed to cover the upper surface of the silicon substrate and the upper end part of the through-hole, wherein the coating film that covers the upper end part of the through-hole is a window part that transmits the light having a predetermined wavelength.

7 Claims, 5 Drawing Sheets

CAP, SEMICONDUCTOR DEVICE INCLUDING THE CAP, AND MANUFACTURING METHOD THEREFOR

CROSS-REFERENCE TO RELATED APPLICATIONS

This application is based upon and claims the benefit of priority of the prior Japanese Patent Application No. 2014-054009 filed on Mar. 17, 2014, the entire contents of which are incorporated herein by reference.

FIELD

The embodiments discussed herein are related to a cap, a semiconductor device including the cap, and a manufacturing method therefor.

BACKGROUND

Conventionally, there is known a semiconductor apparatus having a structure in which a semiconductor device (e.g., MEMS (Micro Electro Mechanical Systems) device, light emitting diode) is encapsulated therein by mounting the semiconductor device in a recess of a substrate and bonding the substrate to a cap that covers the recess. For example, a through-wiring may be formed at a bottom part of the recess to have one end of the through-wiring connected to the semiconductor device provided in the recess. Further, the other end of the through-wiring is exposed from the bottom part of the recess to function as an external connection terminal. Further, a wiring may also be formed in the recess.

In order to manufacture the semiconductor apparatus, a flat substrate such as a silicon substrate, a ceramic substrate, or a resin substrate is prepared. Then, a recess is formed by removing a portion of the flat substrate. Then, a through-wiring or a wiring is formed in the recess, and a semiconductor device is mounted in the recess. Then, a substrate formed of glass, silicon, resin or the like is prepared as a cap for covering the recess. The cap is bonded to the flat substrate to encapsulate the semiconductor device in the recess. Patent Document 1: Japanese Laid-Open Patent Publication No. 10-98121

However, due to the technical difficulty of forming of the through-wiring or the wiring in the recess, the process of manufacturing the semiconductor apparatus becomes complicated. This leads to an increase of manufacturing cost of the semiconductor apparatus.

SUMMARY

According to an aspect of the invention, there is provided a cap for installing a semiconductor device that can send or receive a light having a predetermined wavelength. The cap includes a recess for installing the semiconductor device, the recess being defined by a through-hole penetrating an upper surface of a silicon substrate and a lower surface of the silicon substrate, the through-hole having an upper end part of the through-hole on a side of the upper surface of the silicon substrate and a lower end part of the through-hole on a side of the lower surface of the silicon substrate, and a coating film formed to cover the upper surface of the silicon substrate and the upper end part of the through-hole. The coating film that covers the upper end part of the through-hole is a window part that transmits the light having a predetermined wavelength.

The object and advantages of the invention will be realized and attained by means of the elements and combinations particularly pointed out in the claims.

It is to be understood that both the foregoing general description and the followed detailed description are exemplary and explanatory and are not restrictive of the invention as claimed.

DESCRIPTION OF EMBODIMENTS

In the following, embodiments of the present invention are described with reference to the accompanying drawings. Throughout the drawings, like reference numerals are used to denote like parts and components and further explanation thereof may be omitted.

First Embodiment

Structure of Semiconductor Apparatus of the First Embodiment

Figure 1A:
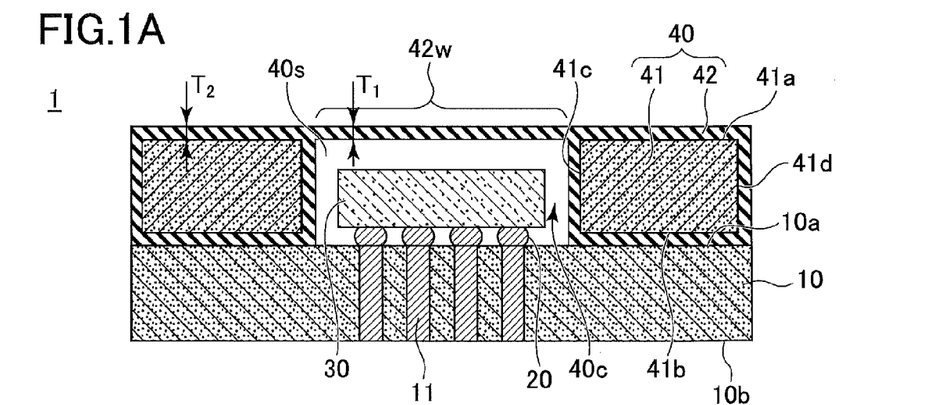
FIGS. 1A and 1B are schematic diagrams illustrating a semiconductor apparatus according to a first embodiment of the present invention.
Figure 1B:
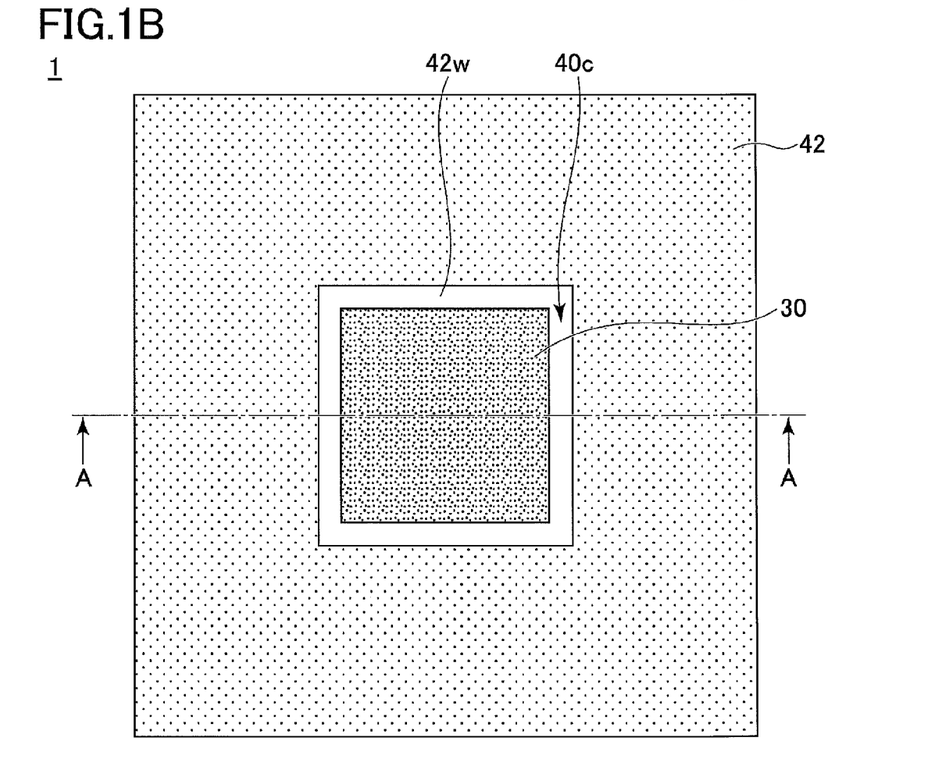

First, a structure of a semiconductor apparatus 1 according to the first embodiment of the present invention is described. FIGS. 1A and 1B are schematic diagrams illustrating the semiconductor apparatus 1 of the first embodiment. FIG. 1B is a plan view of the semiconductor apparatus 1, and FIG. 1A is a cross-sectional view of the semiconductor apparatus 1 taken along line A-A of FIG. 1B.

With reference to FIGS. 1A and 1B, the semiconductor apparatus 1 includes, for example, a substrate 10, a bonding part 20, a semiconductor device 30, and a cap 40.

For the sake of convenience, in this embodiment, the side positioned toward the cap 40 of the semiconductor apparatus 1 (upper side in FIG. 1A) may be described as "upper side" or "one side" whereas the side positioned toward the substrate 10 of the semiconductor apparatus 1 (lower side in FIG. 1A) may be described as "lower side" or "other side". Further, a surface of each part (element) positioned toward the side of the cap 40 may be described as "upper surface" or "one surface" whereas a surface of each part (element) positioned toward the substrate 10 may be described as "lower surface" or "other surface". However, the semiconductor apparatus 1 may be used in an upside down state or positioned at a given angle. Further, a "plan view" refers to observing an object from a direction of a line normal to the one surface of the substrate 10. Further, a "plan-view shape"

of an object refers to a shape of the object observed from a direction of a line normal to the one surface of the substrate 10.

The substrate 10 is a part of the semiconductor apparatus 1 that is to become a base member on which the semiconductor device 30 or the like is mounted. The substrate 10 has a flat shape. That is, one surface 10a and another surface 10b of the substrate 10 are flat surfaces. It is to be noted that the term "flat surface" indicates that the one or the other surface 10a, 10b of the substrate 10 does not have a concave-convex structure enabling a semiconductor device to be installed therein. That is, the substrate 10 may have fine-sized concave or convex parts on the one surface 10a and the other surface 10b.

The substrate 10 may be, for example, a silicon substrate. Alternatively, the substrate 10 may be, for example, a glass substrate, a resin substrate, or a ceramic substrate. The plan-view shape of the substrate 10 is, for example, a quadrate shape that is approximately 40 mm square. Alternatively, the plan-view shape of the substrate 10 may be, for example, a rectangular shape, a circular shape, or an elliptical shape. The thickness of the substrate 10 may be, for example, approximately 200 μm.

A through-wiring 11 that penetrates the substrate 10 from the one surface 10a to the other surface 10b may be formed in the substrate 10. For example, copper may be used as the material of the through-wiring 11. The plan-view shape of the through-wiring 11 is, for example, a circular shape having a diameter of approximately 10 μm. The through-wirings 11 may be arranged in a pitch of, for example, approximately 50 μm.

One end surface of the through-wiring 11 (end surface on the side of the one surface of the substrate 10) may be used as a pad for connecting to the bonding part 20. The one end surface of the through-wiring 11 may be, for example, flush with the one surface 10a of the substrate 10. A wiring that is connected to the one end surface of the through-wiring 11 may be formed on the one surface 10a of the surface 10.

Further, another end surface of the through-wiring 11 is exposed from the other surface 10b of the substrate 10. The other end surface of the through-wiring 11 may be used as a pad for external connection. The other end surface of the through-wiring 11 may be, for example, flush with the other surface 10b of the substrate 10. Further, a wiring that is connected to the other end surface of the through-wiring 11 may be formed on the other surface 10b of the substrate 10.

It is to be noted that the substrate 10 is not limited to having a wiring structure constituted by the through-wiring 11. For example, the substrate 10 may have a build-up structure that includes alternately stacked wiring layers and insulating layers.

Further, a protection layer (e.g., solder resist layer) including openings that expose the pads may be formed on an outermost layer of the substrate 10.

The semiconductor device 30 is mounted on the one surface 10a of the substrate 10. An electrode terminal (not illustrated) is connected to the one end surface of the through-wiring 11 interposed by the bonding part 20. The semiconductor device 30 is a semiconductor device that can send or receive light having a predetermined wavelength. For example, the semiconductor device 30 may be a light emitting device (e.g., a light emitting diode or a laser) or an MEMS such as a digital mirror device. The bonding part 20 may be, for example, a solder bump.

A recess 40c is formed in the vicinity of a center part of the cap 40 for installing the semiconductor device 30 therein. The recess 40c is open on the side of the one surface 10a of the substrate 10. A window part 42w for transmitting a light having a predetermined wavelength is provided at a bottom of the recess 40c. The light having a predetermined wavelength is not or hardly transmitted through the cap 40 except at the window part 42w due to the presence of the silicon substrate 41. Although a silicon oxide film (coating film) that transmits the light having a predetermined wavelength is formed on an upper surface 41a of the silicon substrate 41, the light is blocked by the silicon substrate 41. Thus, the light is not or hardly transmitted through the cap 40 except at the window part 42w. The same also applies to the below-described surfaces of the silicon substrate 41 besides the upper surface 41a (i.e., lower surface 41b, inner side surface 41c, outer side surface 41d). The plan-view shape of the recess 40c is, for example, a quadrate that is approximately 20 mm square. Alternatively, the plan-view shape of the recess 40c may be, for example, a rectangular shape, a circular shape, or an elliptical shape.

More specifically, the recess 40c is constituted by a through-hole and the window part 42w. The through-hole penetrates the silicon substrate 41 from the upper surface 41a to the lower surface 41b. The window part 42w includes a coating film that covers an end part of the through-hole on the side of the upper surface 41a of the silicon substrate 41 and transmits the light having a predetermined wavelength. The upper surface 41a of the silicon substrate 41 is covered by the coating film extending from the window part 42w. In this embodiment, a silicon dioxide film 42 is used as the coating film. That is, in this embodiment, the window part 42w is formed by the silicon dioxide film 42, and the upper surface 41a of the silicon substrate 41 is covered by the silicon dioxide film 42 extending from the window part 42w.

In other words, a part of the silicon dioxide film 42 that is formed in the area of the recess 40c on the side of the upper surface 41a of the silicon substrate 41 is exposed. This exposed part of the silicon dioxide film 42 constitutes the window part 42w that transmits the light having a predetermined wavelength.

In this embodiment, the silicon substrate 41 has the lower surface 41b being opposite to the upper surface 41a of the silicon substrate 41, an inner side surface 41c of the silicon substrate 41 being on a side of the through-hole, and an outer side surface 41d being opposite to the inner side surface 41c of the silicon substrate 41. The surfaces of the silicon substrate 41 besides the upper surface 41a (i.e., lower surface 41b, inner side surface 41c, outer side surface 41d) are also covered by the silicon oxide film 42. It is to be noted that the same reference numeral "42" is used to indicate a silicon oxide film that forms the window part 42w, a silicon oxide film that covers the upper surface 41a of the silicon substrate 41, and a silicon oxide film that covers the surfaces of the silicon substrate 41 besides the upper surface 41a (i.e., lower surface 41b, inner side surface 41c, outer side surface 41d) because these silicon oxide films are integrally formed.

The thickness $T_1$ of the silicon oxide film 42 forming the window part 42w is substantially the same as the thickness $T_2$ of the silicon oxide film 42 covering the upper surface 41a of the silicon substrate 41. For example, the thickness $T_1$ may be approximately 1 μm to 10 μm. The light having a predetermined wavelength may be a light having any wavelength but a wavelength absorbed by the silicon oxide film 42. For example, the light having a predetermined wavelength may be visible light, infrared light, or ultraviolet light.

The area in which the silicon oxide film 42 of the window part 42w is formed has substantially the same size (diameter) as the area in which the recess 40c penetrating the silicon substrate 41 is formed. Therefore, the light-condensing efficiency of the semiconductor apparatus 1 can be improved.

The cap 40 is bonded to the one surface 10a of the substrate 10. Thereby, a space 40s is formed by the one surface 10a of the substrate 10 and the recess 40c. The semiconductor device 30 is installed in the space 40s, so that the semiconductor device 30 can send or receive the light having a predetermined wavelength via the window part 42w. The semiconductor device 30 may be encapsulated in vacuum inside the space 40s.

The cap 40 and the one surface 10a of the substrate 10 may be bonded to each other via an adhesive layer (not illustrated). However, the method for bonding the cap 40 and the one surface 10a of the substrate 10 may be arbitrarily selected. For example, by exposing the lower surface 41b of the silicon substrate 41 of the cap 40 and using a glass substrate as the substrate 10, the lower surface 41b of the silicon substrate 41 and the one surface 10a of the substrate 10 can be anodically bonded to each other.

Method for Manufacturing Semiconductor Apparatus of the First Embodiment

Figure 2A:
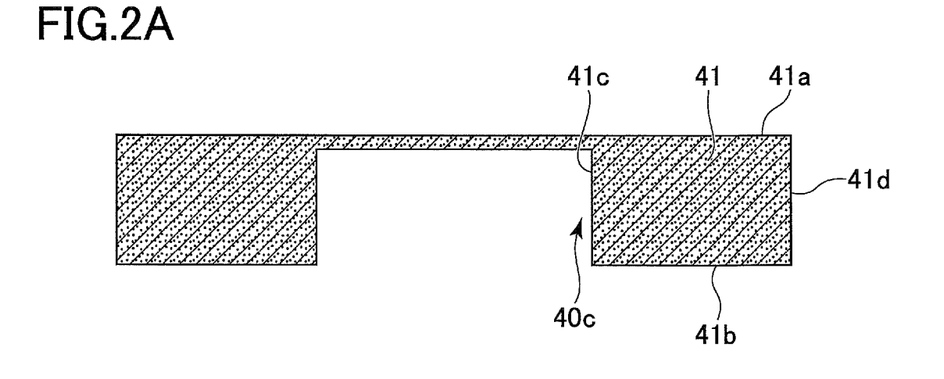
FIGS. 2A and 2B are schematic diagrams for describing the processes for manufacturing the semiconductor apparatus according to the first embodiment of the present invention.
Figure 2B:
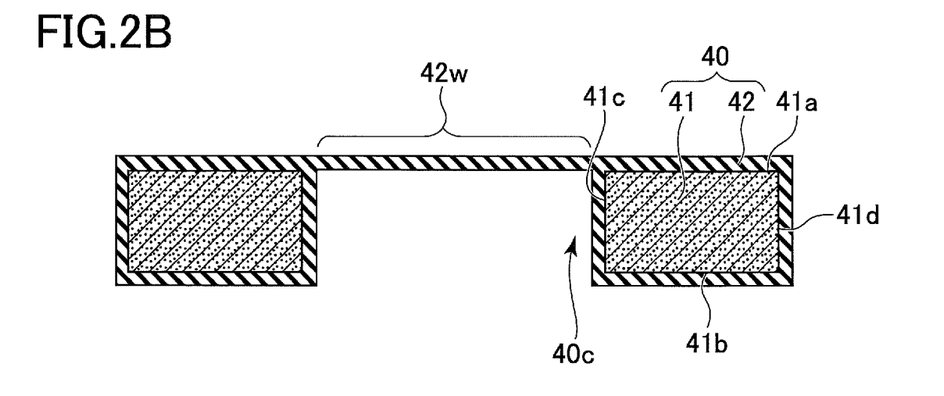

Next, a method for manufacturing a semiconductor apparatus according to the first embodiment of the present invention is described. FIGS. 2A and 2B are schematic diagrams for describing the processes for manufacturing the semiconductor apparatus 1 according to the first embodiment of the present invention. FIGS. 2A and 2B are cross-sectional views corresponding to FIG. 1A.

First, in the process illustrated in FIG. 2A, the silicon substrate 41 having a flat shape with a thickness of approximately 200 µm is prepared. Then, the recess 40c is formed by removing a part of the silicon substrate 41. The recess 40c is open at the vicinity of the center part of the silicon substrate 41 on the side of the lower surface 41b of the substrate 41. Further, a part of the silicon substrate 41 that becomes thin by the removal of the silicon substrate 41 (thinned part) is the bottom of the recess 40c. Although the plan-view shape of the recess 40c is a quadrate shape that is approximately 20 mm square, the plan-view shape of the recess 40c may be, for example, a rectangular shape, a circular shape, or an elliptical shape. The thickness of the part of the silicon substrate 40 that forms the bottom of the recess 40c may be, for example, approximately 1 µm to 10 µm.

For example, a resist layer (not illustrated) is formed on the silicon substrate 41 for forming an opening in an area in which the recess 40c is to be formed. Then, the silicon substrate 41 is etched by using the resist layer as a mask. Thereby, the recess 40c is formed. The etching of the silicon substrate 41 may be performed by using, for example, an anisotropic etching method such as a DRIE (Deep Reactive Ion Etching) method using $SF_6$ (sulfur hexafluoride).

Alternatively, the etching of the silicon substrate 41 may be performed by using, for example, a wet etching method using fluonitric acid. Alternatively, the recess 40c may be formed by using a sandblasting method. The inner side surface 41c of the silicon substrate 41 is not limited to a surface that is orthogonal to the upper surface 41a of the silicon substrate 41. That is, the inner side surface 41c may be an inclined surface (taper surface) with respect to the upper surface 41a of the silicon substrate 41. Further, the inner side surface 41c of the silicon substrate 41 may be a curved surface. The method for forming the recess 40 may be arbitrarily selected according to the shape desired for the inner surface 41c of the silicon substrate 41.

Then, in the process illustrated in FIG. 2B, the silicon substrate 41 is thermally oxidized. The thermal oxidation causes the thinned part of the silicon substrate (i.e. bottom of the recess 40c) to change into the silicon dioxide film 42 and become the window part 42w that transmits the light having a predetermined wavelength. At the same time of the forming of the window part 42w, the surfaces of the silicon substrate 41 besides the upper surface 41a (i.e., lower surface 41b, inner side surface 41c, outer side surface 41d) also become covered by the silicon dioxide film 42 that is integrally formed with the silicon dioxide film 42 that forms the window part 32w.

The thermal oxidation of the silicon substrate 41 may be performed by using, for example, a wet thermal oxidation method in which the vicinity of the surface of the silicon substrate 41 is heated at 1000° C. or more. The thickness of the silicon dioxide film 42 may be, for example, approximately 1 µm to 10 µm. Thereby, the forming of the cap 40 including the silicon substrate 41 and the silicon dioxide film 42 is completed along with the recess 40c having the window part 42w that transmits the light having a predetermined wavelength.

In manufacturing the semiconductor apparatus 1, the substrate 10 including the through-wiring 11 and the like is formed. Then, the semiconductor device 30 is mounted on the one surface 10a of the substrate 10 interposed by the bonding part 20. Then, the cap 40 including the recess 40c is bonded to the one surface 10a of the substrate 10 with an adhesive agent or the like. Thereby, the semiconductor device 30 is installed in the space 40s formed by the one surface 10a of the substrate 10 and the recess 40c, so that the semiconductor device 30 can send or receive the light having a predetermined wavelength via the window part 42w.

Accordingly, with the semiconductor apparatus 1 of the above-described embodiment, the recess 40c is formed in the cap 40 whereas the surface of the substrate 10 on which the semiconductor device 30 is mounted is flat without having a recess. Therefore, the through-wiring 11 or a wiring (not illustrated) does not need to be formed in the cap 40 including the recess 40c but can be formed in the substrate 10 having the flat surface. That is, the through-wiring 11 or a wiring can be formed in the substrate 10 by a simple manufacturing process instead of having to perform a technically difficult process of forming the through-wiring 11 or a wiring in the recess 40c. Therefore, manufacturing cost of the semiconductor apparatus 1 can be reduced.

Because the cap 40 includes the window part 42w that transmits light having a predetermined wavelength, the semiconductor device 30 installed in the semiconductor apparatus 1 can easily send or receive optical signals having a predetermined wavelength with the outside.

Because the silicon dioxide film 42 that forms the window part 42w is integrally formed with the silicon dioxide film 42 formed on the surface of the silicon substrate 41 (upper surface 41a, lower surface 41b, inner side surface 41c, outer side surface 41d), generation of stress in the cap 40 can be reduced, and the cap 40 can be formed with a flat shape. Further, in this embodiment, the thickness of the cap 40 can be reduced because a separate window member need not be provided on the upper surface 41a of the silicon substrate 41.

First Modified Example of the First Embodiment

The first modified example of the first embodiment illustrates a process for manufacturing a cap that is different from the above-described process of the first embodiment. In the first modified example of the first embodiment, like components are denoted with like reference numerals as of the reference numerals of the first embodiment and are not further explained.

Figure 3A:
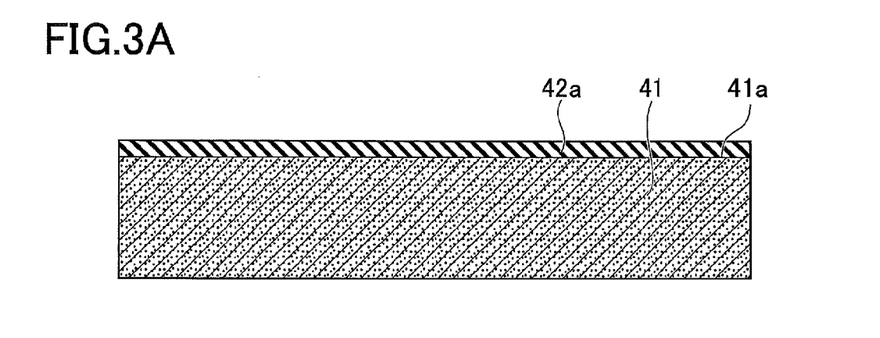
FIGS. 3A-3C are schematic diagrams for describing the processes for manufacturing a modified example of the semiconductor apparatus according to the first embodiment of the present invention.
Figure 3B:
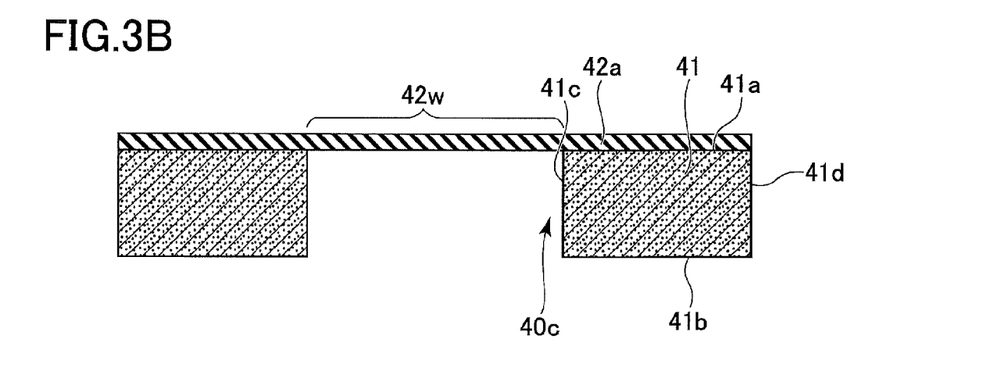
Figure 3C:
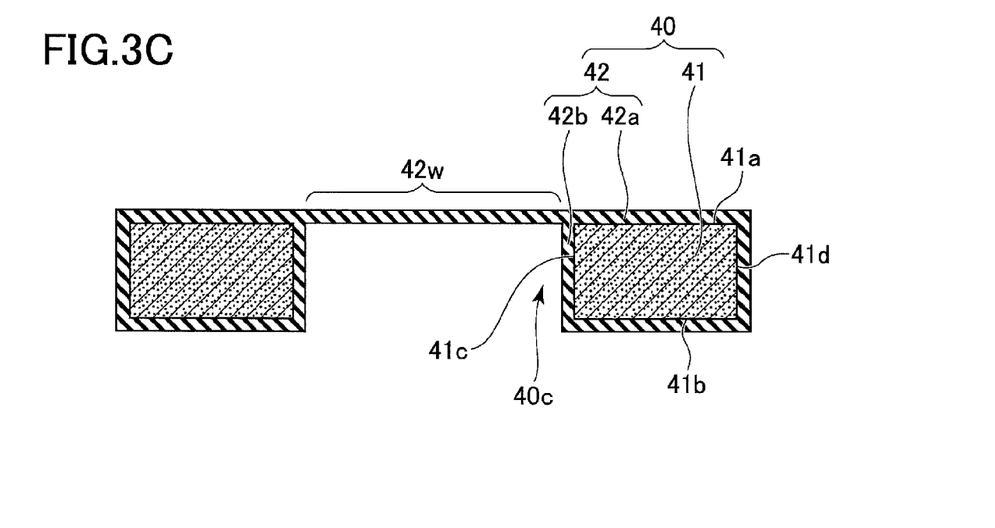

FIGS. 3A-3C are schematic diagrams for describing the processes for manufacturing the semiconductor apparatus 1 according to the first modified example of the first embodiment. FIGS. 3A-3C are cross-sectional views corresponding to FIG. 1A. First, in the process illustrated in FIG. 3A, the silicon substrate 41 having a flat shape with a thickness of approximately 200 µm is prepared. Then, the silicon dioxide film 42a is formed by performing thermal oxidation on the upper surface 41a of the silicon substrate 41. The thermal oxidation method that is used may be the same as the thermal oxidation method used for forming the silicon dioxide film 42 illustrated in FIG. 2B. The thickness of the silicon dioxide film 42a may be, for example, approximately 1 µm to 10 µm.

Then, in the process illustrated in FIG. 3B, the recess 40c is formed by removing a part of the silicon substrate 41. The part of the silicon substrate 41 is removed from the side of the lower surface 41b, so that the recess 40c is open at the vicinity of the center part of the silicon substrate 41 on the side of the lower surface 41b of the substrate 41. The silicon dioxide film 42a formed in the process of FIG. 3A is exposed at the bottom of the recess 40c. The silicon dioxide film 42a exposed at the bottom of the recess 40c becomes the window part 42w for transmitting light having a predetermined wavelength. In a case where the recess 40c is formed by a dry etching process or a wet etching process, the silicon dioxide film 42a can be used as an etch-stop layer.

Then, in the process illustrated in FIG. 3C, the silicon substrate 41 is thermally oxidized. By the thermal oxidation, the surfaces of the silicon substrate 41 besides the upper surface 41a (i.e., lower surface 41b, inner side surface 41c, outer side surface 41d) become covered by the silicon dioxide film 42b. Thus, the silicon dioxide film 42b and the silicon dioxide film 42a are integrated to form the silicon dioxide film 42. The thermal oxidation method that is used may be the same as the thermal oxidation method used for forming the silicon dioxide film 42 illustrated in FIG. 2B. The thickness of the silicon oxide film 42b may be, for example, substantially the same as the thickness of the silicon oxide film 42a. Thereby, the forming of the cap 40 including the silicon substrate 41 and the silicon dioxide film 42 constituted by the integrated silicon dioxide films 42a, 42b is completed along with the recess 40c having the window part 42w that transmits the light having a predetermined wavelength.

It is to be noted that a sputtering method or the like may be used instead of the thermal oxidation method used in the process illustrated in FIG. 3A. In this case, a coating film such as a silicon nitride film (SiN), an alumina film ($Al_2O_3$), a zinc oxide film (ZnO) or a diamond film (DLC) may be formed instead of the silicon dioxide film 42a by using the sputtering method. In a case where the coating film is formed in the process of FIG. 3A, the window part 42w can transmit light of a different wavelength compared to the case of forming the silicon dioxide film 42a because the light absorption wavelength of the coating film is different from the light absorption wavelength of the silicon dioxide film 42a.

Further, the structural body formed in the process of FIG. 3B, may be used as a cap. That is, instead of forming a coating film on the lower surface 41b, the inner side surface 41c, and the outer side surface 41d of the silicon substrate 41, the silicon on the lower surface 41b, the inner side surface 41c, and the outer side surface 41d of the silicon substrate 41 may be exposed. Alternatively, a coating film such as a silicon dioxide film may be formed only on a part of the lower surface 41b, the inner side surface 41c, and the outer side surface 41d of the silicon substrate 41. For example, a silicon dioxide film or the like may be formed only on the inner side surface 41c and the outer side surface 41d of the silicon substrate 41 whereas the silicon of the silicon substrate 41 is exposed from the lower surface 41b. In this case, the lower surface 41b of the silicon substrate 41 can be bonded to a glass substrate as described above.

Second Modified Example of the First Embodiment

The second modified example of the first embodiment illustrates a process for manufacturing a cap that is different from the above-described process of the first embodiment. In the second modified example of the first embodiment, like components are denoted with like reference numerals as of the reference numerals of the first embodiment and are not further explained.

Figure 4A:
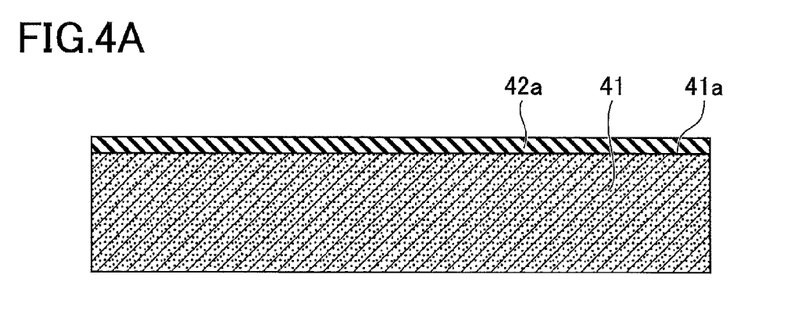
FIGS. 4A-4C are schematic diagrams for describing the processes for manufacturing a second modified example of the semiconductor apparatus according to the first embodiment of the present invention.
Figure 4B:
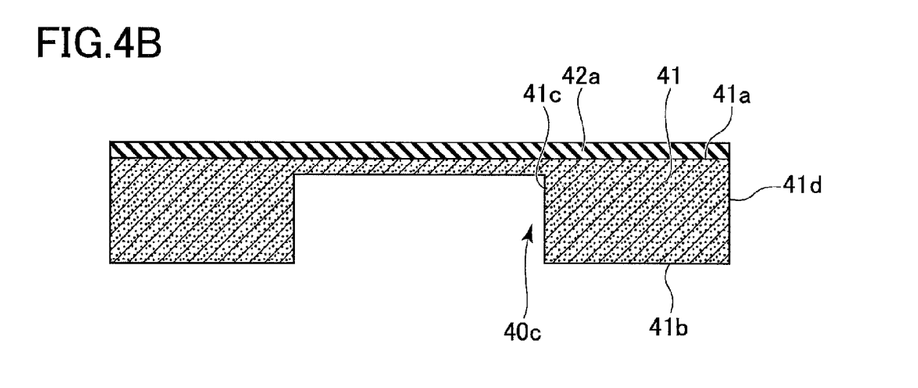
Figure 4C:
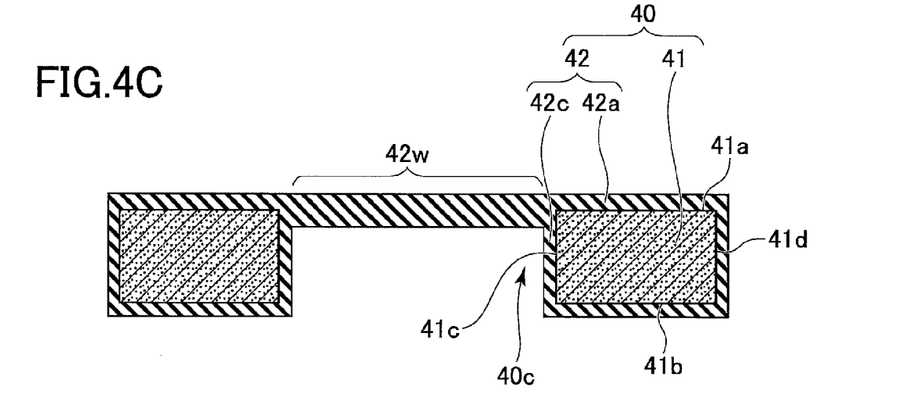

FIGS. 4A-4C are schematic diagrams for describing the processes for manufacturing the semiconductor apparatus 1 according to the second modified example of the first embodiment. FIGS. 4A-4C are cross-sectional views corresponding to FIG. 1A. First, similar to the process of FIG. 3A, the silicon substrate 41 having a flat shape with a thickness of approximately 200 µm is prepared in the process illustrated in FIG. 4A. Then, the silicon dioxide film 42a is formed by performing thermal oxidation on the upper surface 41a of the silicon substrate 41.

Then, in the process illustrated in FIG. 4B, the recess 40c is formed by removing a part of the silicon substrate 41. The part of the silicon substrate 41 is removed from the side of the lower surface 41b, so that the recess 40c is open at the vicinity of the center part of the silicon substrate 41 on the side of the lower surface 41b of the substrate 41. The bottom of the recess 40c is formed of the silicon dioxide film 42a and the thinned part of the silicon substrate 41 provided on the side of the lower surface of the silicon dioxide film 42a.

The thickness of the silicon dioxide film 42a forming the bottom of the recess 40c may be, for example, approximately 1 µm to 10 µm. The thickness of the thinned part of the silicon substrate 41 forming the bottom of the recess 40c may be, for example, approximately 1 µm to 10 µm. The thickness of the silicon dioxide film 42a may be substantially the same as the thickness of the thinned part of the silicon substrate 41.

Then, in the process illustrated in FIG. 4C, the silicon substrate 41 is thermally oxidized. The thermal oxidation causes the thinned part of the silicon substrate 41 to change into the silicon dioxide film 42c. The thermal oxidation also causes the silicon dioxide film 42c to cover the surfaces of the silicon substrate 41 besides the upper surface 41a (i.e., lower surface 41b, inner side surface 41c, outer side surface 41d). Thus, the silicon dioxide film 42c and the silicon dioxide film 42a are integrated to form the silicon dioxide film 42. The silicon dioxide film 42 including the integrated silicon dioxide films 42a, 42c that form the bottom of the recess 40 becomes the window part 42w that transmits light of a predetermined wavelength.

The thermal oxidation method may be the same as the thermal oxidation method used for forming the silicon dioxide film 42 illustrated in FIG. 2B. The thickness of the silicon dioxide film 42 that forms the window part 42w (total thickness of the silicon dioxide film 42a and the silicon dioxide film 42c) may be, for example, approximately 2 µm to 20 µm. Thereby, the forming of the cap 40 including the silicon substrate 41 and the silicon dioxide film 42 constituted by the integrated silicon dioxide films 42a, 42c is completed along with the recess 40c having the window part 42w that transmits the light having a predetermined wavelength.

Compared to the methods for manufacturing the cap 40 according to the first embodiment and the first modified example of the first embodiment, the thickness of the silicon dioxide film 42 forming the window part 42w can be increased. Therefore, the strength of the window part 42w can be improved.

Similar to the process of FIG. 3A, a sputtering method or the like may be used instead of the thermal oxidation method used in the process of FIG. 4A. In this case, a coating film such as a silicon nitride film (SiN), an alumina film ($Al_2O_3$), a zinc oxide film (ZnO), or a diamond film (DLC) may be formed instead of the silicon dioxide film 42a by using the sputtering method.

For example, in a case where the coating film is formed in the process of FIG. 4A, the window part 42w is formed by a composite film having the coating film layered on the silicon oxide film 42 of FIG. 4C. Because the coating film and the silicon oxide film 42 have different light absorption wavelengths, the wavelength of the light transmitting the composite film is different compared to the case where only the silicon oxide film 42 is formed. That is, by forming the window part 42w with the composite film including the coating film formed on the silicon oxide film 42, the range of the wavelength of the light transmitting the window part 42w can be determined according to the combination of the coating film constituting the composite film.

Working Example

Figure 5:
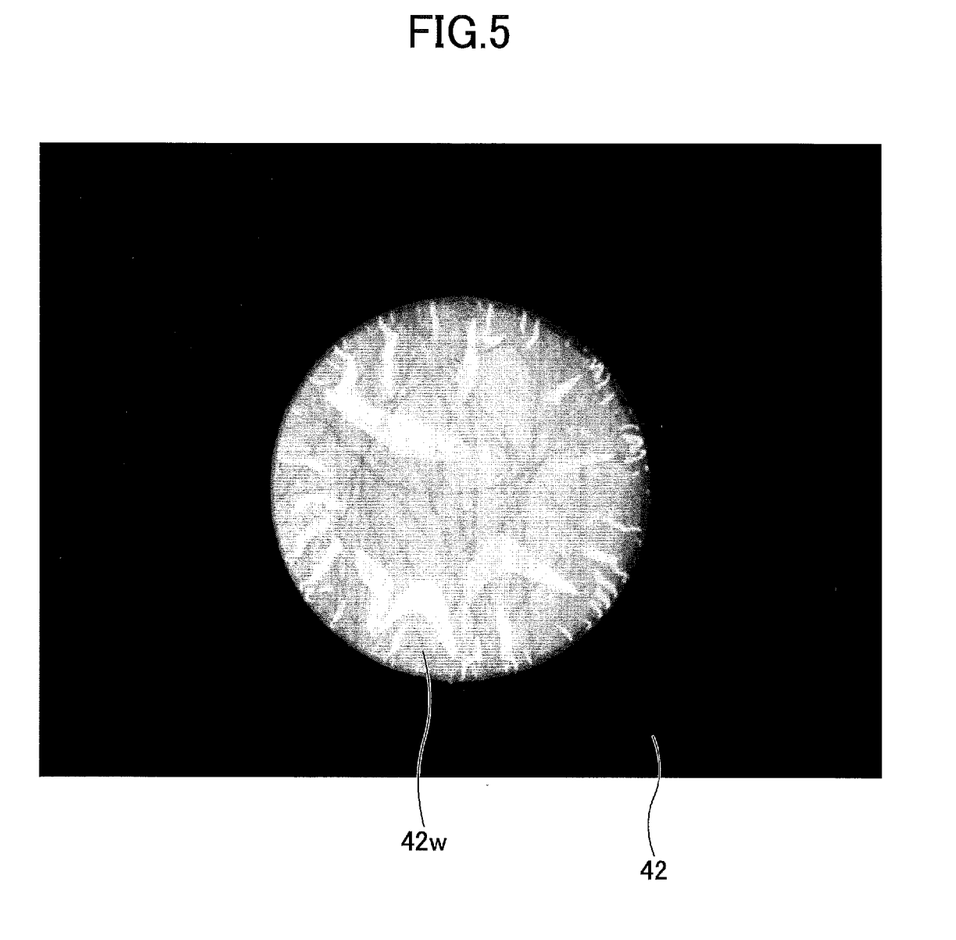
FIG. 5 is a microscope photo of a result obtained according to an embodiment of the present invention.

A cap was manufactured by using the manufacturing method of the first embodiment. It is, however, to be noted that, although the plan-view shape of the recess is a rectangular shape in the first embodiment, the plan-view shape of the working example was a circular shape having a diameter of approximately 2.5 mm (circular window part). FIG. 5 is a microscope photo of a result obtained according to the working example. FIG. 5 illustrates a plan-view shape of the cap manufactured by the working example.

In FIG. 5, reference numeral 42 indicates an area of a silicon substrate on which a silicon dioxide film is formed. In the area indicated by reference numeral 42, the silicon substrate (black area) is visible by way of the silicon dioxide film. Therefore, it can be understood that a light having a predetermined wavelength (e.g., visible light) cannot be transmitted at the area indicated by reference numeral 42 due to the presence of the silicon substrate. On the other hand, reference, numeral 42w indicates a window part (approximately 1 µm in thickness) formed only by the silicon dioxide film. In the area indicated by reference numeral 42w, a surface of a tray or the like on which the cap is placed (gray area) is visible byway of the silicon dioxide film. Therefore, it can be understood that a light having a predetermined wavelength (e.g., visible light) can be transmitted at the area indicated by reference numeral 42w (window part).

Accordingly, by manufacturing a cap according to the manufacturing method of the first embodiment, it can be understood that a window part formed of silicon dioxide film can fabricated and transmit a light having a predetermined wavelength therethrough.

With the above-described embodiment and modified examples of the present invention, a cap and a semiconductor apparatus including the cap can be manufactured with a reduced manufacturing cost.

Various aspects of the subject matter described herein are set out non-exhaustively in the following numbered clauses:

1. A method for manufacturing a cap including a recess for installing a semiconductor device that can send or receive a light having a predetermined wavelength, the method comprising:

forming the recess by removing a part of a silicon substrate to form a thinned part in the silicon substrate at a bottom of the recess; and thermally oxidizing the silicon substrate;

wherein the recess is defined by a through-hole penetrating an upper surface of the silicon substrate and a lower surface of the silicon substrate, the through-hole having an upper end part of the through-hole on a side of the upper surface of the silicon substrate and a lower end part of the through-hole on a side of the lower surface of the silicon substrate, and a coating film formed to cover the upper surface of the silicon substrate and the upper end part of the through-hole, wherein in the thermal oxidizing, the coating film that covers the upper end part of the through-hole changes into a silicon dioxide film to form a window part that transmits the light having a predetermined wavelength, and wherein in the thermal oxidizing, the silicon dioxide film that covers the upper surface of the silicon substrate is integrally formed with the silicon dioxide film forming the window part.

2. A method for manufacturing a cap including a recess for installing a semiconductor device that can send or receive a light having a predetermined wavelength, the method comprising:

forming a coating film on an upper surface of a silicon substrate; and exposing the coating film at a bottom of the recess by removing a part of the silicon substrate from a side of a lower surface of the silicon substrate;

wherein the recess is defined by a through-hole penetrating the upper surface of the silicon substrate and the lower surface of the silicon substrate, the through-hole having an upper end part of the through-hole on a side of the upper surface of the silicon substrate and a lower end part of the through-hole on a side of the lower surface of the silicon substrate, and the coating film covering the upper surface of the silicon substrate and the upper end part of the through-hole, wherein the coating film exposed at the bottom of the recess is a window part that transmits the light having a predetermined wavelength.

9. The method of clause 8, wherein the silicon substrate has the lower surface being opposite to the upper surface of the silicon substrate, an inner side surface of the silicon substrate on a side of the through-hole, and an outer side surface being opposite to the inner side surface of the silicon substrate, wherein the coating film is a first silicon dioxide film, wherein the silicon substrate is thermally oxidized after the exposing of the coating film, wherein the thermal oxidizing includes forming a second silicon dioxide film that covers the lower surface, the inner side surface, and the outer side surface of the silicon substrate, and wherein the first silicon dioxide film is integrally formed with the second silicon dioxide film.

10. A method for manufacturing a cap including a recess for installing a semiconductor device that can send or receive a light having a predetermined wavelength, the method comprising:

forming a coating film on an upper surface of a silicon substrate;

forming the recess by removing a part of the silicon substrate from a side of a lower surface of the silicon substrate to form a thinned part in the silicon substrate on the side of the lower surface of the silicon substrate; and thermally oxidizing the silicon substrate;

wherein the recess is defined by a through-hole penetrating the upper surface of the silicon substrate and the lower surface of the silicon substrate, the through-hole having an upper end part of the through-hole on a side of the upper surface of the silicon substrate and a lower end part of the through-hole on a side of the lower surface of the silicon substrate, and the coating film formed to cover the upper surface of the silicon substrate and the upper end part of the through-hole, wherein in the thermal oxidizing, the thinned part of the silicon substrate changes into a first silicon dioxide film, the silicon substrate has the lower surface being opposite to the upper surface of the silicon substrate, an inner side surface of the silicon substrate on a side of the through-hole, and an outer side surface being opposite to the inner side surface of the silicon substrate, wherein in the thermal oxidizing, the lower surface, the inner side surface, and the outer side surface of the silicon substrate becomes covered by the first silicon dioxide film, and wherein the first silicon dioxide film and the coating film form a window part that transmits the light having a predetermined wavelength at the bottom of the recess.

11. The method of clause 10, wherein the coating film is a second silicon dioxide film, and wherein in the thermal oxidizing, the first silicon dioxide film is integrally formed with the second silicon dioxide film.

12. A method for manufacturing a semiconductor apparatus, the method comprising:

mounting a semiconductor device on one surface of a substrate; and bonding the cap manufactured by the method of clause 7 to the one surface of the substrate;

wherein the semiconductor device is installed in a space defined by the one surface of the substrate and the recess for sending or receiving the light having a predetermined wavelength by way of the window part.

13. A method for manufacturing a semiconductor apparatus, the method comprising:

mounting a semiconductor device on one surface of a substrate; and bonding the cap manufactured by the method of clause 8 to the one surface of the substrate;

wherein the semiconductor device is installed in a space defined by the one surface of the substrate and the recess for sending or receiving the light having a predetermined wavelength by way of the window part.

14. A method for manufacturing a semiconductor apparatus, the method comprising:

mounting a semiconductor device on one surface of a substrate; and bonding the cap manufactured by the method of clause 10 to the one surface of the substrate;

wherein the semiconductor device is installed in a space defined by the one surface of the substrate and the recess for sending or receiving the light having a predetermined wavelength by way of the window part.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, multiple semiconductor devices may be mounted in the recess 40c of the semiconductor apparatus 1. For example, a light emitting device and a light receiving device may be mounted in the recess 40c.

Further, a component other than a semiconductor device may be mounted in the recess 40c of the semiconductor apparatus 1. For example, a passive component (e.g., resistor) or a reflector for reflecting light may be mounted in the recess 40c.

What is claimed is:

1. A cap comprising:

a through-hole penetrating an upper surface of a silicon substrate and a lower surface of the silicon substrate, the silicon substrate including an inner side surface exposed in the through-hole and an outer side surface located on an opposite side of the inner side surface, the through-hole including an upper end part of the through-hole located on a side of the upper surface of the silicon substrate and a lower end part of the through-hole located on a side of the lower surface of the silicon substrate; and a silicon dioxide film covering the upper surface of the silicon substrate, the lower surface of the silicon substrate, the inner side surface of the silicon substrate, the outer side surface of the silicon substrate, and the upper end part of the through-hole;

wherein a part of the silicon dioxide film that covers the upper end part of the through-hole, a part of the silicon dioxide film that covers the upper surface of the silicon substrate, a part of the silicon dioxide film that covers the inner side surface of the silicon substrate, and a part of the silicon dioxide film that covers the outer side surface of the silicon substrate are integrally formed;

wherein the lower end part of the through-hole is open;

wherein the part of the silicon dioxide film that covers the upper end part of the through-hole and the part of the silicon dioxide film that covers the inner side surface of the silicon substrate define a recess; and wherein the part of the silicon dioxide coating film that covers the upper end part of the through-hole is a window part that transmits the light having a predetermined wavelength.

2. The cap as claimed in claim 1, wherein the part of the silicon dioxide film that covers the upper end part of the through-hole has a same diameter as a diameter of the through-hole.

3. The cap as claimed in claim 1, wherein the part of silicon dioxide film that covers the upper end part of the through-hole has a same thickness as a thickness of the part of the silicon dioxide film that covers the upper surface of the silicon substrate.

4. The cap as claimed in claim 1, wherein the part of the silicon dioxide film that covers the upper end part of the through-hole has a greater thickness than a thickness of the part of the silicon dioxide film that covers the upper surface of the silicon substrate and a thickness of the part of the dioxide film that covers the surface of the silicon substrate other than the upper surface of the silicon substrate.

5. A semiconductor apparatus comprising:
a substrate;
a semiconductor device that is mounted on one surface of the substrate; and
the cap of claim 1 that is bonded to the one surface of the substrate;
wherein the semiconductor device is installed in a space defined by the one surface of the substrate and the recess for sending or receiving the light having a predetermined wavelength by way of the window part.

6. The cap as claimed in claim 1, wherein the window part has a same diameter as a diameter of the recess.

7. The cap as claimed in claim 1,
wherein the window part is a bottom of the recess, and
wherein the window part has a thickness that is less than a depth of the recess.

* * * * *